United States Patent [19]

Somon

[11] Patent Number: 5,504,710

[45] Date of Patent: Apr. 2, 1996

[54] SEMICONDUCTOR MEMORY DEVICE HAVING A BIT CONTROL CIRCUIT

[75] Inventor: Junji Somon, Kawasaki, Japan

[73] Assignee: Matsushita Electric Industrial Co., Ltd., Osaka, Japan

[21] Appl. No.: 378,974

[22] Filed: Jan. 27, 1996

[30] Foreign Application Priority Data

Feb. 14, 1994 [JP] Japan .................................. 6-017191

[51] Int. Cl.⁶ .............................. G11C 7/00; G11C 8/00
[52] U.S. Cl. .................. 365/189.05; 365/230.06; 365/230.08
[58] Field of Search ..................... 365/189.05, 230.08, 365/230.06, 189.01, 230.01

[56] References Cited

U.S. PATENT DOCUMENTS

| | | | |
|---|---|---|---|
| 5,268,873 | 12/1993 | Suzuki | 365/189.05 X |
| 5,276,649 | 1/1994 | Hoshita et al. | 365/230.08 X |
| 5,357,469 | 10/1994 | Sommer et al. | 365/230.08 X |
| 5,400,292 | 3/1994 | Fukiage et al. | 365/230.03 X |

FOREIGN PATENT DOCUMENTS

| | | |
|---|---|---|
| 61992 | 1/1986 | Japan . |
| 2168496 | 6/1990 | Japan . |

Primary Examiner—David C. Nelms
Assistant Examiner—Huan Hoang
Attorney, Agent, or Firm—Pollock, Vande Sande & Priddy

[57] ABSTRACT

A semiconductor memory device includes a memory cell array. The memory cell array is accessed word by word in response to an address signal. A bit control circuit is operative for generating a bit control signal. An I/O buffer is operative for transmitting data between the memory cell array and an external bus when the memory cell array is accessed. The I/O buffer includes a section for controlling an effective bit or effective bits in one word related to the accessing of the memory cell array in response to the bit control signal, and a section for controlling a position of the effective bit or the positions of the effective bits in one word related to the accessing of the memory cell array in response to the bit control signal.

3 Claims, 8 Drawing Sheets

FIG. 4

| INPUT DATA | | | | OUTPUT DATA | | | | | | |
|---|---|---|---|---|---|---|---|---|---|---|
| A14 | A13 | A12 | A11 | S2 | S1 | S0 | D8 | D4 | D2 | D1 |
| 0 | 0 | 0 | 0 | 0 | 0 | 0 | 1 | 0 | 0 | 0 |
| 0 | 0 | 0 | 1 | 0 | 0 | 0 | 0 | 0 | 0 | 0 |
| 0 | 0 | 1 | 0 | 0 | 0 | 0 | 0 | 1 | 0 | 0 |
| 0 | 0 | 1 | 1 | 1 | 0 | 0 | 0 | 1 | 0 | 0 |
| 0 | 1 | 0 | 0 | 0 | 1 | 0 | 0 | 0 | 1 | 0 |
| 0 | 1 | 0 | 1 | 1 | 0 | 0 | 0 | 0 | 1 | 0 |
| 0 | 1 | 1 | 0 | 1 | 1 | 0 | 0 | 0 | 1 | 0 |
| 0 | 1 | 1 | 1 | 0 | 0 | 0 | 0 | 0 | 1 | 0 |
| 1 | 0 | 0 | 0 | 0 | 0 | 1 | 0 | 0 | 0 | 1 |
| 1 | 0 | 0 | 1 | 0 | 1 | 0 | 0 | 0 | 0 | 1 |
| 1 | 0 | 1 | 0 | 0 | 1 | 1 | 0 | 0 | 0 | 1 |
| 1 | 0 | 1 | 1 | 1 | 0 | 0 | 0 | 0 | 0 | 1 |
| 1 | 1 | 0 | 0 | 1 | 0 | 1 | 0 | 0 | 0 | 1 |
| 1 | 1 | 0 | 1 | 1 | 1 | 0 | 0 | 0 | 0 | 1 |
| 1 | 1 | 1 | 0 | 1 | 1 | 1 | 0 | 0 | 0 | 1 |
| 1 | 1 | 1 | 1 | 0 | 0 | 0 | 0 | 0 | 0 | 1 |

FIG. 7

| CONTROL SIGNALS <br> ? : DON'T MIND | | | | | | | | | INPUT DATA/OUTPUT DATA <br> Z : HIGH-IMPEDANCE OUTPUT | | | | | | | |
|---|---|---|---|---|---|---|---|---|---|---|---|---|---|---|---|---|
| R | W | S2 | S1 | S0 | D8 | D4 | D2 | D1 | E7 | E6 | E5 | E4 | E3 | E2 | E1 | E0 |
| 1 | 0 | 0 | 0 | 0 | 1 | 0 | 0 | 0 | B7 | B6 | B5 | B4 | B3 | B2 | B1 | B0 |
| 1 | 0 | 0 | 0 | 0 | 0 | 0 | 0 | 0 | 0 | 0 | 0 | 0 | 0 | 0 | 0 | 0 |
| 1 | 0 | 0 | 0 | 0 | 0 | 1 | 0 | 0 | 0 | 0 | 0 | 0 | B3 | B2 | B1 | B0 |
| 1 | 0 | 1 | 0 | 0 | 0 | 1 | 0 | 0 | 0 | 0 | 0 | 0 | B7 | B6 | B5 | B4 |
| 1 | 0 | 0 | 1 | 0 | 0 | 0 | 1 | 0 | 0 | 0 | 0 | 0 | 0 | 0 | B1 | B0 |
| 1 | 0 | 1 | 0 | 0 | 0 | 0 | 1 | 0 | 0 | 0 | 0 | 0 | 0 | 0 | B3 | B2 |
| 1 | 0 | 1 | 1 | 0 | 0 | 0 | 1 | 0 | 0 | 0 | 0 | 0 | 0 | 0 | B5 | B4 |
| 1 | 0 | 0 | 0 | 0 | 0 | 0 | 1 | 0 | 0 | 0 | 0 | 0 | 0 | 0 | B7 | B6 |
| 1 | 0 | 0 | 0 | 1 | 0 | 0 | 0 | 1 | 0 | 0 | 0 | 0 | 0 | 0 | 0 | B0 |
| 1 | 0 | 0 | 1 | 0 | 0 | 0 | 0 | 1 | 0 | 0 | 0 | 0 | 0 | 0 | 0 | B1 |
| 1 | 0 | 0 | 1 | 1 | 0 | 0 | 0 | 1 | 0 | 0 | 0 | 0 | 0 | 0 | 0 | B2 |
| 1 | 0 | 1 | 0 | 0 | 0 | 0 | 0 | 1 | 0 | 0 | 0 | 0 | 0 | 0 | 0 | B3 |
| 1 | 0 | 1 | 0 | 1 | 0 | 0 | 0 | 1 | 0 | 0 | 0 | 0 | 0 | 0 | 0 | B4 |
| 1 | 0 | 1 | 1 | 0 | 0 | 0 | 0 | 1 | 0 | 0 | 0 | 0 | 0 | 0 | 0 | B5 |
| 1 | 0 | 1 | 1 | 1 | 0 | 0 | 0 | 1 | 0 | 0 | 0 | 0 | 0 | 0 | 0 | B6 |
| 1 | 0 | 0 | 0 | 0 | 0 | 0 | 0 | 1 | 0 | 0 | 0 | 0 | 0 | 0 | 0 | B7 |
| 0 | ? | ? | ? | ? | ? | ? | ? | ? | Z | Z | Z | Z | Z | Z | Z | Z |

FIG. 8

| CONTROL SIGNALS ? : DON'T MIND | | | | | | | | | INPUT DATA/OUTPUT DATA Z : HIGH-IMPEDANCE OUTPUT | | | | | | | |
|---|---|---|---|---|---|---|---|---|---|---|---|---|---|---|---|---|
| R | W | S2 | S1 | S0 | D8 | D4 | D2 | D1 | B7 | B6 | B5 | B4 | B3 | B2 | B1 | B0 |
| 0 | 1 | 0 | 0 | 0 | 1 | 0 | 0 | 0 | E7 | E6 | E5 | E4 | E3 | E2 | E1 | E0 |
| 0 | 1 | 0 | 0 | 0 | 0 | 0 | 0 | 0 | Z | Z | Z | Z | Z | Z | Z | Z |
| 0 | 1 | 0 | 0 | 0 | 0 | 1 | 0 | 0 | Z | Z | Z | Z | E3 | E2 | E1 | E0 |
| 0 | 1 | 1 | 0 | 0 | 0 | 1 | 0 | 0 | E3 | E2 | E1 | E0 | Z | Z | Z | Z |
| 0 | 1 | 0 | 1 | 0 | 0 | 0 | 1 | 0 | Z | Z | Z | Z | Z | Z | E1 | E0 |
| 0 | 1 | 1 | 0 | 0 | 0 | 0 | 1 | 0 | Z | Z | Z | Z | E1 | E0 | Z | Z |
| 0 | 1 | 1 | 1 | 0 | 0 | 0 | 1 | 0 | Z | Z | E1 | E0 | Z | Z | Z | Z |
| 0 | 1 | 0 | 0 | 0 | 0 | 0 | 1 | 0 | E1 | E0 | Z | Z | Z | Z | Z | Z |
| 0 | 1 | 0 | 0 | 1 | 0 | 0 | 0 | 1 | Z | Z | Z | Z | Z | Z | Z | E0 |
| 0 | 1 | 0 | 1 | 0 | 0 | 0 | 0 | 1 | Z | Z | Z | Z | Z | Z | E0 | Z |
| 0 | 1 | 0 | 1 | 1 | 0 | 0 | 0 | 1 | Z | Z | Z | Z | Z | E0 | Z | Z |
| 0 | 1 | 1 | 0 | 0 | 0 | 0 | 0 | 1 | Z | Z | Z | Z | E0 | Z | Z | Z |
| 0 | 1 | 1 | 0 | 1 | 0 | 0 | 0 | 1 | Z | Z | Z | E0 | Z | Z | Z | Z |
| 0 | 1 | 1 | 1 | 0 | 0 | 0 | 0 | 1 | Z | Z | E0 | Z | Z | Z | Z | Z |
| 0 | 1 | 1 | 1 | 1 | 0 | 0 | 0 | 1 | Z | E0 | Z | Z | Z | Z | Z | Z |
| 0 | 1 | 0 | 0 | 0 | 0 | 0 | 0 | 1 | E0 | Z | Z | Z | Z | Z | Z | Z |
| ? | 0 | ? | ? | ? | ? | ? | ? | ? | Z | Z | Z | Z | Z | Z | Z | Z |

SEMICONDUCTOR MEMORY DEVICE HAVING A BIT CONTROL CIRCUIT

BACKGROUND OF THE INVENTION

1. Field of the Invention

This invention relates to a semiconductor memory device.

2. Description of the Prior Art

A typical semiconductor memory device has an array of memory cells grouped into plural words each having a given fixed number of bits (a given fixed length). In the semiconductor memory device, data is written and read into and from the memory cell array word by word. Such a semiconductor memory device can not meet a requirement for changing a word length.

Japanese published unexamined patent application 61-992 discloses a semiconductor memory device which includes two memory cell arrays each having a word length of 4 bits. The two memory cell arrays are combined into a composite memory having an effective word length changeable between 4 bits and 8 bits.

Japanese published unexamined patent application 2-168496 discloses a semiconductor memory device in which an effective word length is changeable among 1 bit, 4 bits, 8 bits, and 16 bits.

SUMMARY OF THE INVENTION

It is an object of this invention to provide an improved semiconductor memory device.

A first aspect of this invention provides a semiconductor memory device comprising a memory cell array; means for accessing the memory cell array word by word in response to an address signal; a bit control circuit for generating a bit control signal; and an I/O buffer for transmitting data between the memory cell array and an external when the memory cell array is accessed by the accessing means; wherein the I/O buffer includes means for controlling a total number of an effective bit or effective bits in one word related to the accessing of the memory cell array in response to the bit control signal, and means for controlling a position or positions of the effective bit or effective bits in one word related to the accessing of the memory cell array in response to the bit control signal.

A second aspect of this invention provides a semiconductor memory device comprising an array of memory cells grouped into words; first means for accessing the memory cell array word by word; second means for generating a bit control signal; third means for controlling a total number of an effective bit or effective bits in every word related to the accessing of the memory cell array by the first means in response to the bit control signal; and fourth means for controlling a position or positions of the effective bit or effective bits in every word related to the accessing of the memory cell array by the first means in response to the bit control signal.

In the second aspect of this invention, it is preferable that the first means comprises means for accessing the memory cell array in response to a main address signal, and the second means comprises means for generating the bit control signal in response to an extended address signal separate from the main address signal.

BRIEF DESCRIPTION OF THE DRAWINGS

FIG. 4 is a diagram of the relation between the state of a signal inputted into a bit control circuit and the state of a signal outputted from the bit control circuit in FIG. 2.

FIG. 7 is a diagram of the relation among the states of control signals, the state of a signal inputted into the I/O buffer, and the state of a signal outputted from the I/O buffer in FIG. 2 which occurs during a data reading mode of operation of the semiconductor memory device.

FIG. 8 is a diagram of the relation among the states of control signals, the state of a signal inputted into the I/O buffer, and the state of a signal outputted from the I/O buffer in FIG. 2 which occurs during a data writing mode of operation of the semiconductor memory device.

DESCRIPTION OF THE PREFERRED EMBODIMENT

Before a description of this invention, a prior-art semiconductor memory device of a fixed word length type will be described for a better understanding of this invention.

Figure 1:
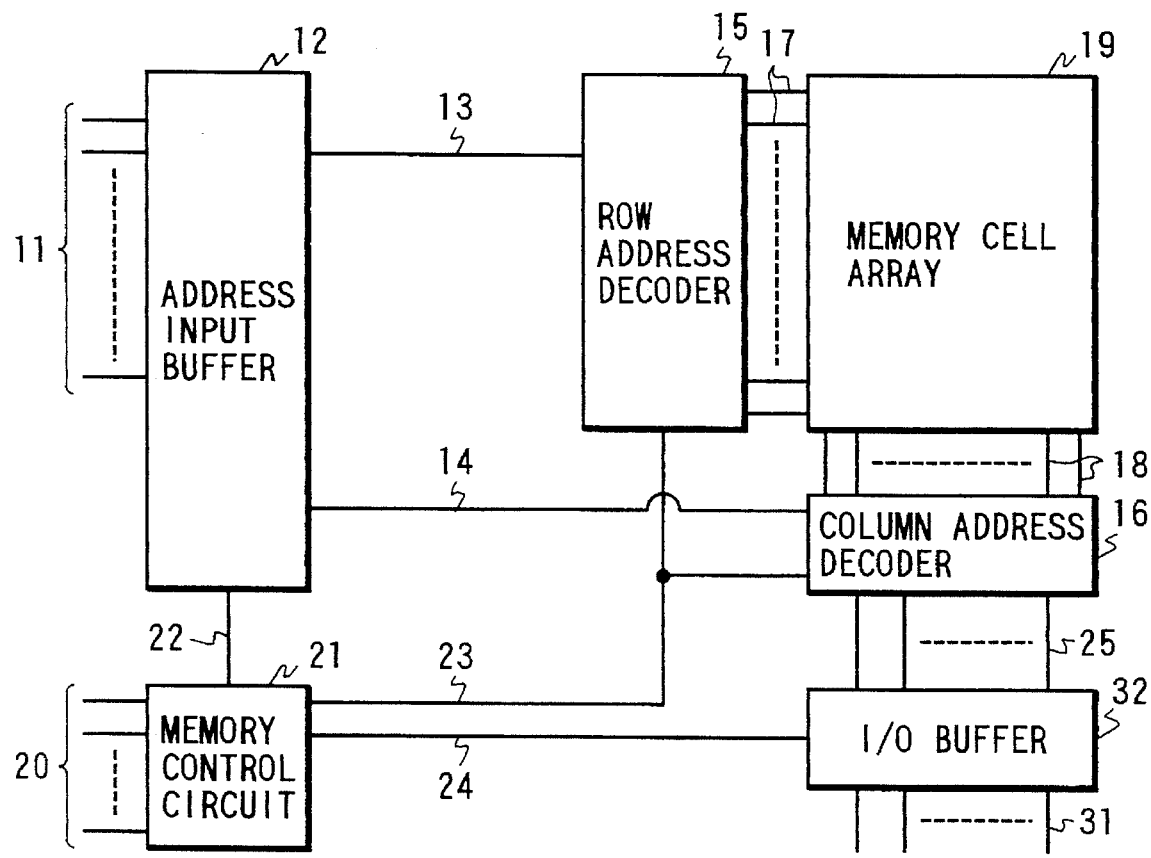
FIG. 1 is a block diagram of a prior-art semiconductor memory device.

FIG. 1 shows a prior-art semiconductor memory device in which an input address signal 11 having a plurality of bits is fed from an external to an address input buffer 12 composed of, for example, gates. The address input buffer 12 serves to selectively enable and inhibit the transmission of the input address signal 11 to subsequent stages. A first portion of the input address signal 11 which forms a row address signal is transmitted from the address input buffer 12 to a row address decoder 15 via a multi-bit row address line 13. A second portion of the input address signal 11 which forms a column address signal is transmitted from the address input buffer 12 to a column address decoder 16 via a multi-bit column address line 14.

The row address decoder 15 is connected via "m" word lines 17 to an array 19 of memory cells separated into "m" groups each having "n" bits (cells) where "m" and "n" denote given natural numbers respectively. Thus, the memory cell array 19 has a capacity of "m" by "n" bits. The "m" groups in the memory cell array 19 are connected to the "m" word lines 17 respectively. The device 15 decodes the row address signal fed from the address input buffer 12, and selects and enables (activates) one of the word lines 17 in response to the row address signal. The "n" cells in each of the "m" groups in the memory cell array 19 are connected to "n" bit lines 18 respectively. The "n" bit lines 18 lead to the column address decoder 16.

The column address decoder 16 is connected to an I/O buffer 32 via "k" data lines 25 where "k" denotes a given natural number smaller than the number "n". The device 16 decodes the column address signal fed from the address input buffer 12, and selects "k" bit lines from among the "n" bit lines 18 in response to the column address signal and connects the selected "k" bit lines to the "k" data lines 25 respectively. The I/O buffer 32 is connected to an external data bus 31 having "k" bits. The I/O buffer 32 serves to transmit data between the "k" data lines 25 and the external data bus 31.

A control signal 20 having a plurality of bits is fed from an external to a memory control circuit 21. The memory control circuit 21 generates an address input control signal 22, a decoder control signal 23, and an I/O control signal 24 in response to the external control signal 20. The address input control signal 22 is applied to the address input buffer 12 from the memory control circuit 21. The address input buffer 12 is controlled by the address input control signal 22. The decoder control signal 23 is applied to the row address decoder 15 and the column address decoder 16 from the memory control circuit 21. The row address decoder 15 and the column address decoder 16 are controlled by the decoder control signal 23. The I/O control signal 24 is applied to the I/O buffer 32 from the memory control circuit 21. The I/O buffer 32 is controlled by the I/O control signal 24.

The prior-at semiconductor memory device of FIG. 1 operates as follows. During a data reading mode of operation of the memory device, the input address signal 11 is applied to the address input buffer 12 while the external control signal 20 is applied to the memory control circuit 21. The memory control circuit 21 generates the address input control signal 22, the decoder control signal 23, and the I/O control signal 24 in response to the external control signal 20. The address input control signal 22 is applied to the address input buffer 12. The decoder control signal 23 is applied to the row address decoder 15 and the column address decoder 16. The I/O control signal 24 is applied to the I/O buffer 32.

The address input buffer 12 is enabled in response to the address input control signal 22, transmitting the input address signal (the row address signal and the column address signal) 11 to the subsequent stages. Specifically, the row address signal and the column address signal are transmitted to the row address decoder 15 and the column address decoder 16 via the row address line 13 and the column address line 14 respectively.

The row address decoder 15 is enabled by the decoder control signal 23, decoding the row address signal fed from the address input buffer 12. The row address decoder 15 selects and activates one of the word lines 17 which is designated by the row address signal. Data pieces are outputted to the "n" bit lines 18 from the "n" memory cells respectively which are connected to the activated word line 17. The "n" data pieces are transmitted to the column address decoder 16 via the "n" bit lines 18 respectively.

The column address decoder 16 is enabled by the decoder control signal 23, decoding the column address signal fed from the address input buffer 12. The column address decoder 16 selects "k" bit lines from among the "n" bit lines 18 which are designated by the column address signal. The column address decoder 16 connects the selected "k" bit lines to the "k" data lines 25 respectively so that "k" data pieces composing one word are transmitted from the selected "k" bit lines to the "k" data lines 25 respectively. The 1-word data is applied to the I/O buffer 32 via the data lines 25.

The I/O buffer 32 is controlled by the I/O control signal 24, transmitting the 1-word data from the data lines 25 to the external data bus 31.

As understood from the previous description, in the prior-art semiconductor memory device of FIG. 1, the word length (the number of bits in one word) is fixed to "k" bits.

Figure 2:
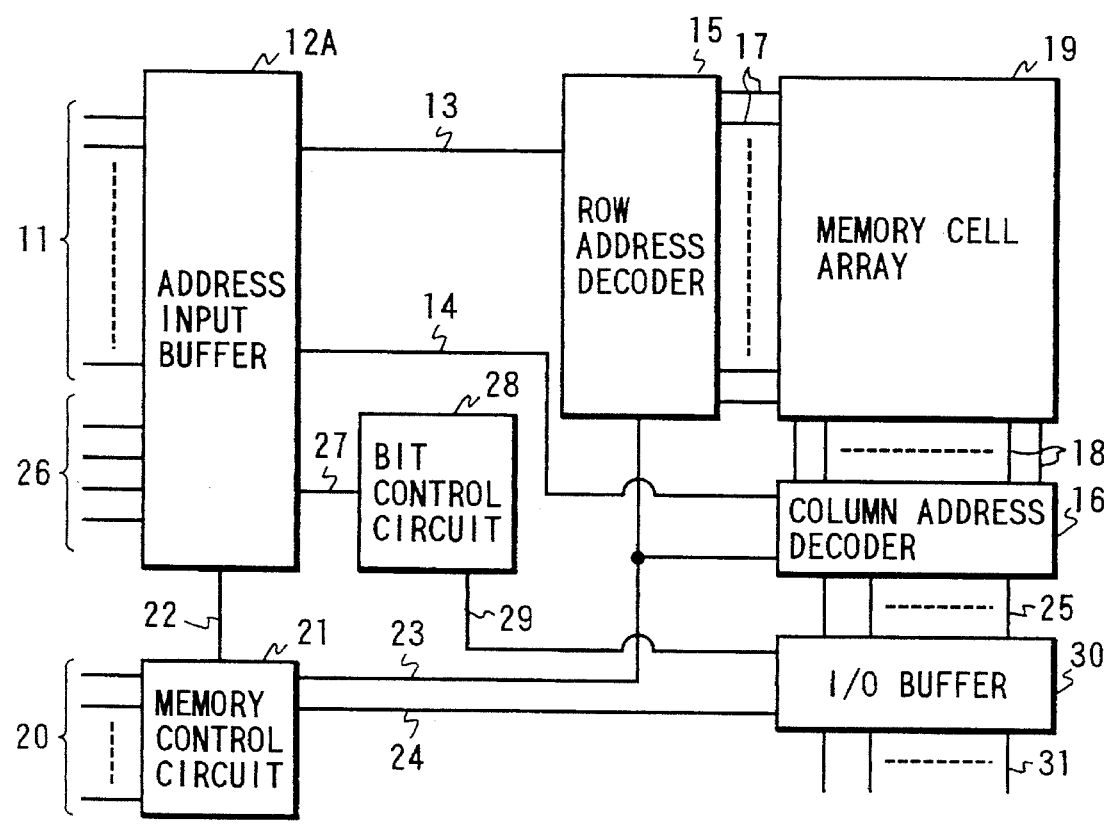
FIG. 2 is a block diagram of a semiconductor memory device according to an embodiment of this invention.

FIG. 2 shows a semiconductor memory device according to an embodiment of this invention. In the semiconductor memory device of FIG. 2, an input address signal 11 having a plurality of bits is fed to an address input buffer 12A.

Generally, the input address signal 11 is generated by a suitable external apparatus (not shown). The address input buffer 12A serves to selectively enable and inhibit the transmission of the input address signal 11 to subsequent stages. A first portion of the input address signal 11 which forms a row address signal can be transmitted from the address input buffer 12A to a row address decoder 15 via a multi-bit row address line 13. A second portion of the input address signal 11 which forms a column address signal can be transmitted from the address input buffer 12A to a column address decoder 16 via a multi-bit column address line 14.

In the semiconductor memory device of FIG. 2, an extended address signal 26 having a plurality of bits is fed to the address input buffer 12A. Generally, the extended address signal 26 is generated by a suitable apparatus (not shown) in the external. The address input buffer 12A serves to selectively enable and inhibit the transmission of the extended address signal 26 to a subsequent stage. Specifically, the extended address signal 26 can be transmitted from the address input buffer 12A to a bit control circuit 28 via a multi-bit extended address signal line 27.

The row address decoder 15 is connected via "m" word lines 17 to an array 19 of memory cells separated into "m" groups each having "n" bits (cells) where "m" and "n" denote given natural numbers respectively. Thus, the memory cell array 19 has a capacity of "m" by "n" bits. The "m" groups in the memory cell array 19 are connected to the "m" word lines 17 respectively. The device 15 decodes the row address signal fed from the address input buffer 12A, and selects and enables (activates) one of the word lines 17 in response to the row address signal. The "n" cells in each of the "m" groups in the memory cell array 19 are connected to "n" bit lines 18 respectively. The "n" bit lines 18 lead to the column address decoder 16.

The column address decoder 16 is connected to an I/O buffer 30 via "k" data lines 25 where "k" denotes a given natural number smaller than the number "n". The device 16 decodes the column address signal fed from the address input buffer 12A, and selects "k" bit lines from among the "n" bit lines 18 in response to the column address signal and connects the selected "k" bit lines to the "k" data lines 25 respectively. The I/O buffer 30 is connected to an external data bus 31 having "k" bits. The I/O buffer 30 serves to transmit data between the "k" data lines 25 and the external data bus 31.

A control signal 20 having a plurality of bits is fed externally to a memory control circuit 21. Generally, the control signal 20 is generated by a suitable external apparatus (not shown). The memory control circuit 21 generates an address input control signal 22, a decoder control signal 23, and an I/O control signal 24 in response to the external control signal 20. The address input control signal 22 is applied to the address input buffer 12A from the memory control circuit 21. The address input buffer 12A is controlled by the address input control signal 22. The decoder control signal 23 is applied to the row address decoder 15 and the column address decoder 16 from the memory control circuit 21. The row address decoder 15 and the column address decoder 16 are controlled by the decoder control signal 23. The I/O control signal 24 is applied to the I/O buffer 30 from the memory control circuit 21. The I/O buffer 30 is controlled by the I/O control signal 24.

Figure 3:
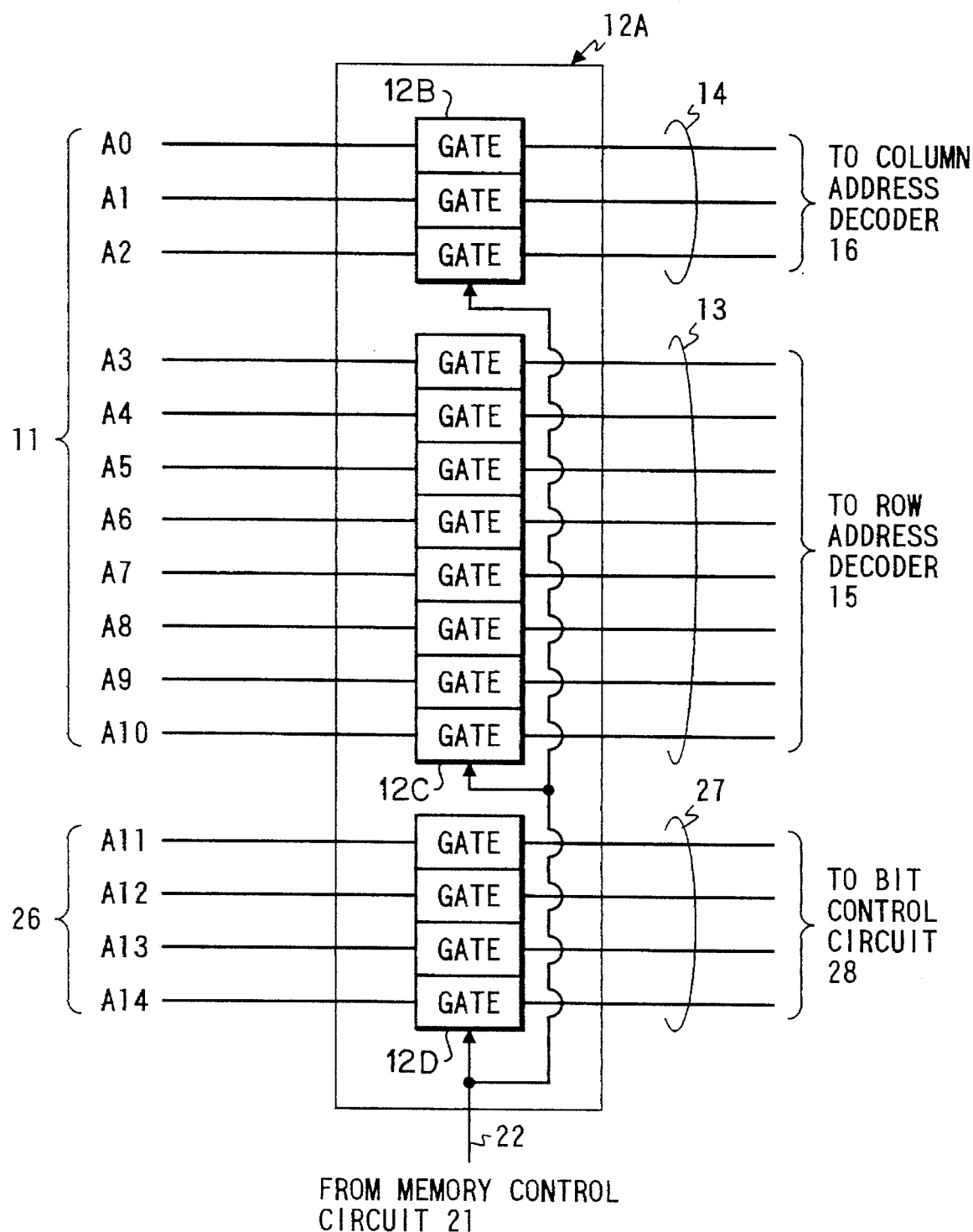
FIG. 3 is a block diagram of an address input buffer in FIG. 2.

As shown in FIG. 3, the input address signal 11 has, for example, 11 bits A0, A1, A2, A3, A4, A5, A6, A7, A8, A9, and A10. The bits A0, A1, and A2 of the input address signal 11 compose a column address signal. The bits A3, A4, A5, A6, A7, A8, A9, and A10 of the input address signal 11 compose a row address signal. The extended address signal 26 has, for example, 4 bits A11, A12, A13, and A14.

As shown in FIG. 3, the address input buffer 12A includes gate units 12B, 12C, and 12D subjected to the address input control signal 22 fed from the memory control circuit 21. The gate unit 12B receives the bits A0, A1, and A2 of the input address signal 11, that is, the column address signal. When the address input control signal 22 assumes a high level, the gate unit 12B transmits the column address signal to the column address decoder 16 via the column address line 14. When the address input control signal 22 assumes a low level, the gate unit 12B inhibits the transmission of the column address signal to the column address decoder 16. The gate unit 12C receives the bits A3, A4, A5, A6, A7, A8, A9, and A10 of the input address signal 11, that is, the row address signal. When the address input control signal 22 assumes the high level, the gate unit 12C transmits the row address signal to the row address decoder 15 via the row address line 13. When the address input control signal 22 assumes the low level, the gate unit 12C inhibits the transmission of the row address signal to the row address decoder 15. The gate unit 12D receives the extended address signal 26. When the address input control signal 22 assumes the high level, the gate unit 12D transmits the extended address signal 26 to the bit control circuit 28 via the extended address signal line 27. When the address input control signal 22 assumes the low level, the gate unit 12D inhibits the transmission of the extended address signal 26 to the bit control circuit 28.

With reference to FIG. 2, the bit control circuit 28 generates a bit control signal 29 in response to the extended address signal 26 fed from the address input buffer 12A. The bit control circuit 28 outputs the bit control signal 29 to the I/O buffer 30. The I/O buffer 30 transmits data between the "k" data lines 25 and the external data bus 31 in response to the bit control signal 29 and also the I/O control signal 24. As will be described later, the I/O buffer 30 has the function of changing the effective word length (the number of effective bits) of data outputted to an external means such as the external data bus 31, and also the function of changing the effective word length (the number of effective bits) of data outputted to the data lines 25. The word-length changing functions are controlled by the bit control signal 29.

The bit control circuit 28 includes, for example, a ROM, a combination of logic circuits, or a decoder. The bit control circuit 28 decodes the extended address signal 26 into the bit control signal 29. For example, the extended address signal 26 has 4 bits A11, A12, A13, A14 while the bit control signal 29 has 7 bits D1, D2, D4, D8, S0, S1, and S2.

FIG. 4 shows the relation between the state of the extended address signal (A14, A13, A12, A11) inputted to the bit control circuit 28 and the state of the bit control signal 29 (S2, S1, S0, D8, D4, D2, D1) outputted from the bit control circuit 28. As shown in FIG. 4, the bit control signal 29 assumes a state of "0001000" when the extended address signal is "0000". The bit control signal 29 assumes a state of "0000000" when the extended address signal is "0001". The bit control signal 29 assumes a state of "0000100" when the extended address signal is "0010". The bit control signal 29 assumes a state of "1000100" when the extended address signal is "0011". The bit control signal 29 assumes a state of "0100010" when the extended address signal is "0100". The bit control signal 29 assumes a state of "1000010" when the extended address signal is "0101". The bit control signal 29 assumes a state of "1100010" when the extended address signal is "0110". The bit control signal 29 assumes a state of "0000010" when the extended address signal is "0111". The bit control signal 29 assumes a state of "0010001" when the extended address signal is "1000". The bit control signal 29 assumes a state of "0100001" when the extended address signal is "1001". The bit control signal 29 assumes a state of "0110001" when the extended address signal is "1010". The bit control signal 29 assumes a state of "1000001" when the extended address signal is "1011". The bit control signal 29 assumes a state of "1010001" when the extended address signal is "1100". The bit control signal 29 assumes a state of "1100001" when the extended address signal is "1101". The bit control signal 29 assumes a state of "1110001" when the extended address signal is "1110". The bit control signal 29 assumes a state of "0000001" when the extended address signal is "1111"

As will be made clear later, the bits S0, S1, and S2 in the bit control signal 29 denote the amount of data shift in bit position while the bits D1, D2, D4, and D8 in the bit control signal 29 denote the output data bit length or the effective word length (the number of effective bits) of data outputted from the I/O buffer 30 to the external data bus 31 or the data lines 25.

In the case where the bit control circuit 28 includes a ROM, the extended address signal is applied to the ROM as an address signal. In this case, 16 different data pieces corresponding to the respective 16 states of the bit control signal 29 (see right-hand side of FIG. 4) are previously stored in memory segments of the ROM which have different addresses respectively.

The I/O buffer 30 transmits data between the data lines 25 and the external data bus 31 in response to the bit control signal 29 and also the I/O control signal 24. For example, the data lines 25 are represented by 8 bits B0, B1, B2, B3, B4, B5, B6, and B7 while the external data bus 31 has also 8 bits E0, E1, E2, E3, E4, E5, E6, and E7. For example, the I/O control signal 24 has two bits R and W representing a read signal and a write signal respectively.

Figure 5:
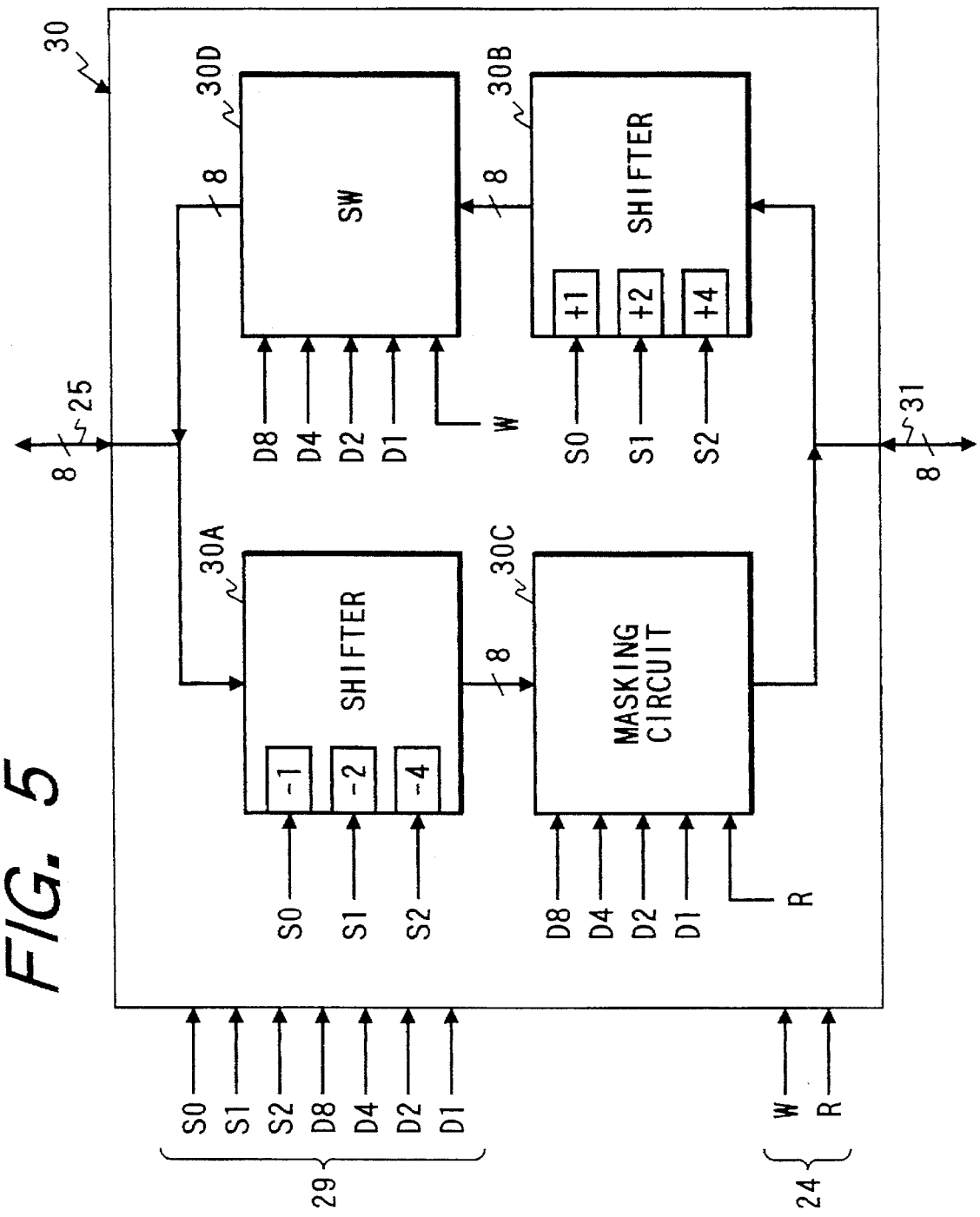
FIG. 5 is a block diagram of a first example of an I/O buffer in FIG. 2.

FIG. 5 shows a first example of the I/O buffer 30. The I/O buffer 30 of FIG. 5 includes shifters 30A and 30B, a masking circuit 30C, and a switch unit 30D. The shifter 30A and the masking circuit 30C are used during a data reading mode of operation of the memory device. On the other hand, the shifter 30B and the switch unit 30D are used during a data writing mode of operation of the memory device.

In the I/O buffer 30 of FIG. 5, the input side of the shifter 30A is connected to the data lines 25. The output side of the shifter 30A is connected to the input side of the masking circuit 30C. The output side of the masking circuit 30C is connected to the external data bus 31. The input side of the shifter 30B is connected to the external data bus 31. The output side of the shifter 30B is connected to the input side of the switch unit 30D. The output side of the switch unit 30D is connected to the data lines 25.

The shifter 30A receives 8-bit data from the data lines 25. The shifter 30A has first, second, and third control terminals subjected to the bits S0, S1, and S2 of the bit control signal 29 respectively. The circuit 30A shifts the received 8-bit data in bit position by an mount depending on the states of the bits S0, S1, and S2 of the bit control signal 29, and outputs the resultant 8-bit data to the masking circuit 30C. The masking circuit 30C is subjected to the bits D1, D2, D4, and D8 of the bit control signal 29. The masking circuit 30C is also subjected to the bit R of the I/O control signal 24, that is, the read signal R. The masking circuit 30C is enabled and disabled by the read signal R during a data reading mode and a data writing mode of operation of the memory device respectively. The masking circuit 30C receives the 8-bit data from the shifter 30A. The masking circuit 30C masks higher bits of the received data with a signal of "0", and outputs the resultant 8-bit data to the external data bus 31. The number of masked higher bits depends on the states of the bits D1, D2, D4, and D8 of the bit control signal 29.

For example, the masking circuit 30C includes a decoder, a signal source, and eight switches connected between the bits of the input side and the bits of the output side respectively. The decoder converts the bits D1, D2, D4, and D8 of the bit control signal 29 into switch control signals fed to the eight switches respectively. The signal source outputs a "0" signal to the eight switches. Each of the eight switches selects one of a bit signal outputted from the shifter 30A and the "0" signal in response to the related switch control signal.

The shifter 30B receives 8-bit data from the external data bus 31. The shifter 30B has first, second, and third control terminals subjected to the bits S0, S1, and S2 of the bit control signal 29 respectively. The circuit 30B shifts the received 8-bit data in bit position by an amount depending on the states of the bits S0, S1, and S2 of the bit control signal 29, and outputs the resultant 8-bit data to the switch unit 30D. The switch unit 30D is subjected to the bits D1, D2, D4, and D8 of the bit control signal 29. The switch unit 30D is also subjected to the bit W of the I/O control signal 24, that is, the write signal W. The switch unit 30D is enabled and disabled by the write signal W during a data writing mode and a data reading mode of operation of the memory device respectively. The switch unit 30D receives the 8-bit data from the shifter 30B. The switch unit 30D breaks the connection of higher bits between the input side and the output side while maintaining the connection of the remaining bits between the input side and tile output side. In other words, the switch unit 30D sets higher bits of the output side to high-impedance states Z, and transmits the remaining bits of the received data to the associated data lines 25 respectively. The number of connection-broken higher bits depends on the states of the bits D1, D2, D4, and D8 of the bit control signal 29.

For example, the switch unit 30D includes a decoder, and eight switches connected between the bits of the input side and the bits of the output side respectively. The decoder converts the bits D1, D2, D4, and D8 of the bit control signal 29 into switch control signals fed to the eight switches respectively. Each of the eight switches changes between a conductive state and a non-conductive state in response to the related switch control signal.

Figure 6:
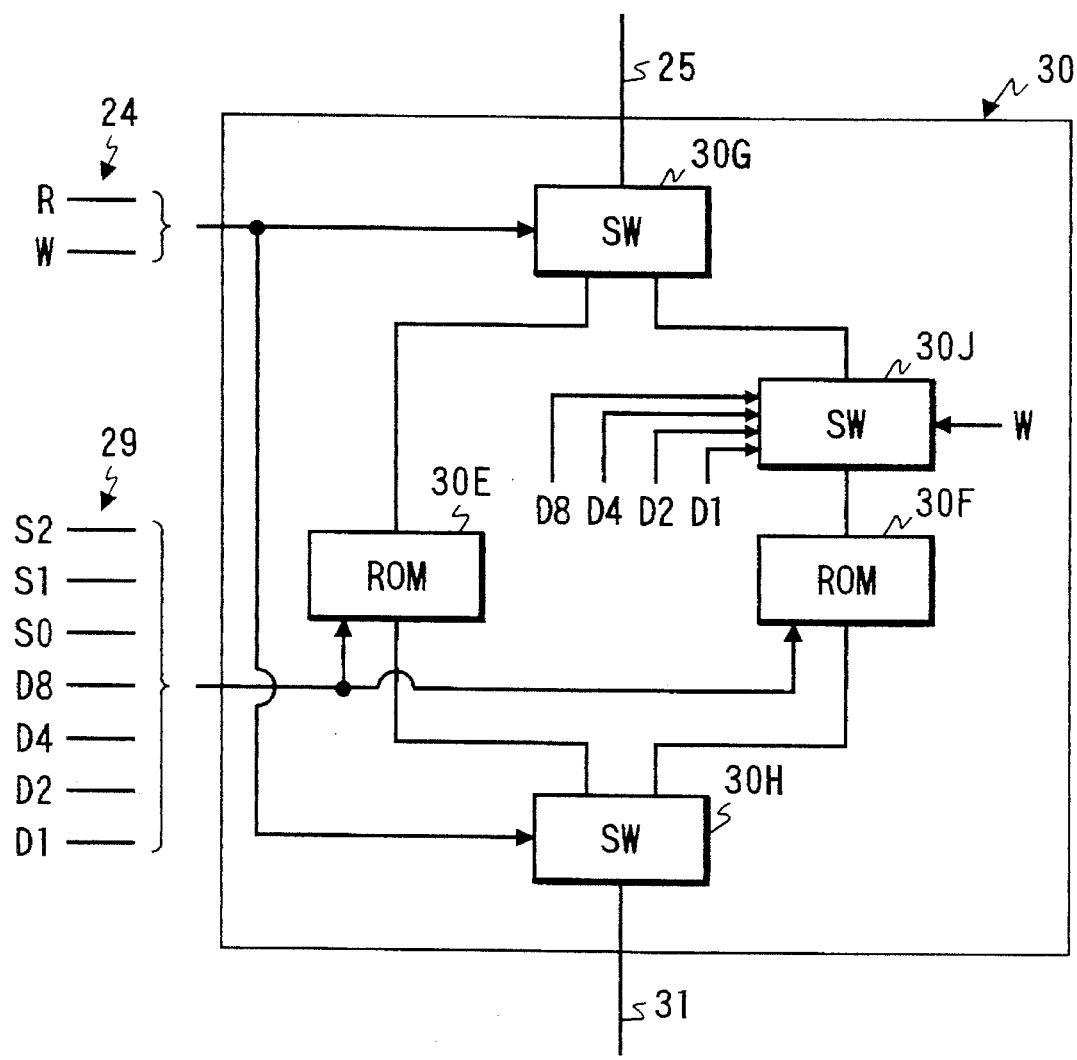
FIG. 6 is a block diagram of a second example of the I/O buffer in FIG. 2.

FIG. 6 shows a second example of the I/O buffer 30. The I/O buffer 30 of FIG. 6 includes first and second ROM's 30E and 30F, switches 30G and 30H, and a switch unit 30J. The first ROM 30E is connected to the data lines 25 via tile switch 30G. The second ROM 30F is connected to the data lines 25 via the switch unit 30J and the switch 30G. The first and second ROM's 30E and 30F are connected to the external data bus 31 via the switch 30H. The bit control signal 29 (S2, S1, S0, D8, D4, D2, D1) is applied to the first and second ROM's 30E and 30F. The bits R and W of the I/O control signal 24 are applied to the switches 30G and 30H. The switches 30G and 30H serve to select one of the first and second ROM's 30E and 30F in response to the I/O control signal 24. Specifically, when the bits R and W of the I/O control signal 24 are "1" and "0" respectively, the first ROM 30E is selected and used as a result of operation of the switches 30G and 30H. When the bits R and W of the I/O control signal 24 are "0" and "1" respectively, the second ROM 30F is selected and used as a result of operation of the switches 30G and 30H.

In the I/O buffer 30 of FIG. 6, the input side of the switch unit 30J is connected to the second ROM 30F while the output side of the switch unit 30J is connected to the switch 30G. The switch unit 30J receives the bits D1, D2, D4, and D8 of the bit control signal 29 and also the bit W of the I/O control signal 24 (the write signal W). The switch unit 30J is similar to the switch unit D of FIG. 5 in structure and operation.

Regarding the I/O buffer 30 of FIG. 6, during a data reading mode of operation of the memory device, the bit control signal 29 (S2, S1, S0. D8, D4, D2, D1) and data on the data lines 25 (B7, B6, B5, B4, B3, B2, B1, B0) are applied to the first ROM 30E as an address signal. Different data pieces corresponding to different states of data outputted to the external data bus 31 (E7, E6, E5, E4, E3, E2, E1, E0) are previously stored in memory segments of the first ROM 30E which have different addresses.

Regarding the I/O buffer 30 of FIG. 6, during a data writing mode of operation of the memory device, the bit control signal 29 (S2, S1, S0, D8, D4, D2, D1) and data pieces on the bits E7, E6, E5, E4, E3, E2, E1, and E0 of the external data bus 31 are applied to the second ROM 30F as an address signal. Different data pieces corresponding to different states of data outputted to the data lines 25 (B7, B6, B5, B4, B3, B2, B1, B0) are previously stored in memory segments of the second ROM 30F which have different addresses.

The I/O buffer 30 of FIG. 5 or FIG. 6 is designed so that, during a data reading mode of operation of the memory device, data transmission from the data lines 25 (B7, B6, B5, B4, B3, B2, B1, B0) to the external data bus 31 (E7, E6. E5, E4, E3, E2, E1, E0) will be controlled in response to the bit control signal 29 (S2, S1, S0, D8, D4, D2, D1) in a manner of FIG. 7. As shown in FIG. 7, data pieces on the data lines B7, B6, B5, B4, B3, B2, B1, and B0 are transmitted to the bits E7, E6, E5, E4, E3. E2, E1, and E0 of the external data bus 31 respectively when the bit control signal 29 is "0001000". None of data pieces on the data lines B7, B6, B5, B4, B3, B2, B1, and B0 is transmitted to the bits E7, E6, E5, E4, E3, E2, E1, and E0 of the external data bus 31 but data pieces outputted to the bits E7, E6, E5, E4, E3, E2, E1, and E0 of the external data bus 31 are set to "0" when the bit control signal 29 is "0000000". Data pieces on the data lines B3. B2, B1, and B0 are transmitted to the bits E3, E2, E1, and E0 of the external data bus 31 but data pieces outputted to the bits E7, E6, E5, and E4 of the external data bus 31 are set to "0" when the bit control signal 29 is "0000100". Data pieces on the data lines B7, B6, B5, and B4 are transmitted to the bits E3. E2, E1, and E0 of the external data bus 31 but data pieces outputted to the bits E7, E6, E5, and E4 of the external data bus 31 are set to "0" when the bit control signal 29 is "1000100". Data pieces on the data lines B1 and B0 are transmitted to the bits E1 and E0 of the external data bus 31 but data pieces outputted to the bits E7, E6, E5, E4, E3, and E2 of the external data bus 31 are set to "0" when the bit control signal 29 is "0100010". Data pieces on the data lines B3 and B2 are transmitted to the bits E1 and E0 of the external data bus 31 but data pieces outputted to the bits E7, E6, E5, E4, E3, and E2 of the external data bus 31 are set to "0" when the bit control signal 29 is "1000010". Data pieces on the data lines B5 and B4 are transmitted to the bits E1 and E0 of the external data bus 31 but data pieces outputted to the bits E7, E6, E5, E4, E3, and E2 of the external data bus 31 are set to "0" when the bit control signal 29 is "1100010". Data pieces on the data lines B7 and B6 are transmitted to the bits E1 and E0 of the external data bus 31 but data pieces outputted to the bits E7, E6, E5, E4, E3, and E2 of the external data bus 31 are set to "0" when the bit control signal 29 is "0000010". A data piece on the data line B0 is transmitted to the bit E0 of the external data bus 31 but data pieces outputted to the bits E7, E6, E5, E4, E3. E2, and E1 of the external data bus 31 are set to "0" when the bit control signal 29 is "0010001". A data piece on the data line B1 is transmitted to the bit E0 of the external data bus 31 but data pieces outputted to the bits E7, E6, E5, E4, E3, E2, and E1 of the external data bus 31 are set to "0" when the bit control signal 29 is "0100001". A data piece on the data line B2 is transmitted to the bit E0 of the external data bus 31 but data pieces outputted to the bits E7, E6, E5, E4, E3, E2, and E1 of the external data bus 31 are set to "0" when the bit control signal 29 is "0110001". A data piece on the data line B3 is transmitted to the bit E0 of the external data bus 31 but data pieces outputted to the bits E7, E6, E5, E4, E3, E2, and E1 of the external data bus 31 are set to "0" when the bit control signal 29 is "1000001" A data piece on the data line B4 is transmitted to the bit E0 of the external data bus 31 but data pieces outputted to the bits E7, E6, E5, E4, E3, E2, and E1 of the external data bus 31 are set to "0" when the bit control signal 29 is "10100001". A data piece on the data line B5 is transmitted to the bit E0 of the external data bus 31 but data pieces outputted to the bits E7, E6, E5, E4, E3, E2, and E1 of the external data bus 31 are set to "0" when the bit control signal 29 is "11000001". A data piece on the data line B6 is transmitted to the bit E0 of the external data bus 31 but data pieces outputted to the bits E7, E6, E5, E4, E3, E2, and E1 of the external data bus 31 are set to "0" when the bit control signal 29 is "11100001". A data piece on the data line B7 is transmitted to the bit E0 of the external data bus 31 but data pieces outputted to the bits E7, E6, E5, E4, E3, E2, and E1 of the external data bus 31 are set to "0" when the bit control signal 29 is "00000001".

Furthermore, the I/O buffer 30 of FIG. 5 or FIG. 6 is designed so that, during a data writing mode of operation of the memory device, data transmission from the external data bus 31 (E7, E6, E5, E4, E3, E2, El, E0) to the data lines 25 (B7, B6, B5, B4, B3, B2, B1, B0) will be controlled in response to the bit control signal 29 (S2, S1, S0, D8, D4, D2, D1) in a manner of FIG. 8. As shown in FIG. 8, data pieces on the bits E7, E6, E5, E4, E3, E2, E1, and E0 of the external data bus 31 are transmitted to the data lines B7, B6, B5, B4, B3, B2, B 1, and B0 respectively when the bit control signal 29 is "0001000". None of the data pieces on the bits E7, E6, E5, E4, E3, E2, E1, and E0 of the external data bus 31 is transmitted to the data lines B7, B6, B5, B4, B3, B2, B1, and B0 but the connections to the data lines B7, B6, B5, B4, B3, B2, B1, and B0 are set to high-impedance states Z when the bit control signal 29 is "0000000". Data pieces on the bits E3, E2, E1, and E0 of the external data bus 31 are transmitted to the data lines B3, B2, B1, and B0 but the connections to the data lines B7, B6, B3, and B4 are set to the high-impedance states Z when the bit control signal 29 is "0000100". Data pieces on the bits E3, E2, E1, and E0 of the external data bus 31 are transmitted to the data lines B7, B6, B5, and B4 but the connections to the data lines B3, B2, B1, and B0 are set to the high-impedance states Z when the bit control signal 29 is "1000100". Data pieces on the bits E1 and E0 of the external data bus 31 are transmitted to the data lines B1 and B0 but the connections to the data lines B7, B6, B3, B4, B3, and B2 are set to the high-impedance states Z when the bit control signal 29 is "0100010". Data pieces on the bits E1 and E0 of the external data bus 31 are transmitted to the data lines B3 and B2 but the connections to the data lines B7, B6, B5, B4, B1, and B0 are set to the high-impedance states Z when the bit control signal 29 is "1000010". Data pieces on the bits E1 and E0 of the external data bus 31 are transmitted to the data lines B5 and B4 but the connections to the data lines B7, B6, B3, B2, B1, and B0 are set to the high-impedance states Z when the bit control signal 29 is "1100010". Data pieces on the bits E1 and E0 of the external data bus 31 are transmitted to the data lines B7 and B6 but the connections to the data lines B5, B4, B3, B2, B1, and B0 are set to the high-impedance states Z when the bit control signal 29 is "0000010". A data piece on the bit E0 of the external data bus 31 is transmitted to the data line B0 but the connections to the data lines B7, B6, B3, B4, B3, B2, and B1 are set to the high-impedance states Z when the bit control signal 29 is "0010001". A data piece on the bit E0 of the external data bus 31 is transmitted to the data line B1 but the connections to the data lines B7, B6, B5, B4, B3, B2, and B0 are set to the high-impedance states Z when the bit control signal 29 is "0100001". A data piece on the bit E0 of the external data bus 31 is transmitted to the data line B2 but the connections to the data lines B7, B6, B5, B4, B3, B1, and B0 are set to the high-impedance states Z when the bit control signal 29 is "0110001" A data piece on the bit E0 of the external data bus 31 is transmitted to the data line B3 but the connections to the data lines B7, B6, B5, B4, B2, B1, and B0 are set to the high-impedance states Z when the bit control signal 29 is "1000001". A data piece on the bit E0 of the external data bus 31 is transmitted to the data line B4 but the connections to the data lines B7, B6, B5, B3, B2, B1, and B0 are set to the high-impedance states Z when the bit control signal 29 is "1010001". A data piece on the bit E0 of the external data bus 31 is transmitted to the data line B5 but the connections to the data lines B7, B6, B4, B3, B2, B1, and B0 are set to the high-impedance states Z when the bit control signal 29 is "1100001". A data piece on the bit E0 of the external data bus 31 is transmitted to the data line B6 but the connections to the data lines B7, B5, B4, B3, B2, B1, and B0 are set to the high-impedance states Z when the bit control signal 29 is "1110001". A data piece on the bit E0 of the external data bus 31 is transmitted to the data line B7 but the connections to the data lines B6, B5, B4, B3, B2, B1, and B0 are set to the high-impedance states Z when the bit control signal 29 is "0000001".

The semiconductor memory device of FIG. 2 operates as follows. During a data reading mode of operation of the memory device, the input address signal 11 is applied to the address input buffer 12A while the external control signal 20 is applied to the memory control circuit 21. The memory control circuit 21 generates the address input control signal 22, the decoder control signal 23, and the I/O control signal 24 in response to the external control signal 20. The address input control signal 22 is applied to the address input buffer 12A. The decoder control signal 23 is applied to the row address decoder 15 and the column address decoder 16. The I/O control signal 24 is applied to the I/O buffer 30.

The address input buffer 12A is enabled in response to the address input control signal 22, transmitting the input address signal (the row address signal and the column address signal) 11 to the subsequent stages. Specifically, the row address signal and the column address signal are transmitted to the row address decoder 15 and the column address decoder 16 via the row address line 13 and the column address line 14 respectively.

The row address decoder 15 is enabled by the decoder control signal 23, decoding the row address signal fed from the address input buffer 12A. The row address decoder 15 selects and activates one of the word lines 17 which is designated by the row address signal. Data pieces are outputted to the "n" bit lines 18 from the "n" memory cells respectively which are connected to the activated word line 17. The "n" data pieces are transmitted to the column address decoder 16 via the "n" bit lines 18 respectively.

The column address decoder 16 is enabled by the decoder control signal 23, decoding the column address signal fed from the address input buffer 12A. The column address decoder 16 selects "k" bit lines from among the "n" bit lines 18 which are designated by the column address signal. The column address decoder 16 connects the selected "k" bit lines to the "k" data lines 25 respectively so that "k" data pieces are transmitted from the selected "k" bit lines to the "k" data lines 25 respectively. The "k" data pieces are applied to the I/O buffer 30 via the "k" data lines 25.

During the data reading mode of operation of the memory device, the extended address signal 26 is fed to the address input buffer 12A. The address input buffer 12A is enabled in response to the address input control signal 22, transmitting the extended address signal 26 to the bit control circuit 28. As previously described, the bit control circuit 28 generates the bit control signal 29 in response to the extended address signal 26 (see FIG. 4). The bit control circuit 28 outputs the bit control signal 29 to the I/O buffer 30. The I/O buffer 30 transmits the data from the data lines 25 to the external data bus 31 in response to the bit control signal 29 and also the I/O control signal 24. In this case, the states of the bits R and W of the I/O control signal 24, the states of the bits S2, S1, S0, D8, D4, D2, D1 of tile bit control signal 29, the states of the data inputted to the I/O buffer 30 from the data lines 25 (B7, B6, B5, B4, B3, B2, B1, B0), and the states of the data outputted from the I/O buffer 30 to the external data bus 31 (E7, E6, E5, E4, E3, E2, E1, E0) have a relation of FIG. 7. As understood from FIG. 7, the effective word length (the number of effective bits) of the data outputted to the external data bus 31 (E7, E6, E5, E4, E3, E2, E1, E0) is changed among 1 bit, 2 bits, 4 bits, and 8 bits in response to the bits D8, D4, D2, and D1 of the bit control signal 29. In addition, the effective bit or bits of the data outputted to the external data bus 31 (E7, E6, E5, E4, E3, E2, E1, E0) occupy the LSB position or successive lower-order bit places starting from the LSB position. Furthermore, the position or positions of a bit or bits selected from among the bits of the data on the data lines 25 as an effective bit or effective bits of the data outputted to the external data bus 31 are controlled in response to the bits S2, S1, and S0 of the bit control signal 29.

During a data writing mode of operation of the memory device, the input address signal 11 is applied to the address input buffer 12A while the external control signal 20 is applied to the memory control circuit 21. The memory control circuit 21 generates the address input control signal 22, the decoder control signal 23, and the I/O control signal 24 in response to the external control signal 20. The address input control signal 22 is applied to the address input buffer 12A. The decoder control signal 23 is applied to the row address decoder 15 and the column address decoder 16. The I/O control signal 24 is applied to the I/O buffer 30.

The address input buffer 12A is enabled in response to the address input control signal 22, transmitting the input address signal (the row address signal and the column address signal) 11 to the subsequent stages. Specifically, the row address signal and the column address signal are transmitted to the row address decoder 15 and the column address decoder 16 via the row address line 13 and the column address line 14 respectively.

During the data writing mode of operation of the memory device, the extended address signal 26 is fed to the address input buffer 12A. The address input buffer 12A is enabled in response to the address input control signal 22, transmitting the extended address signal 26 to the bit control circuit 28. As previously described, the bit control circuit 28 generates the bit control signal 29 in response to the extended address signal 26 (see FIG. 4). The bit control circuit 28 outputs the bit control signal 29 to the I/O buffer 30. The I/O buffer 30 transmits the data from the external data bus 31 to the data lines 25 in response to the bit control signal 29 and also the I/O control signal 24. In this case, the states of the bits R and W of the I/O control signal 24, the states of the bits S2, S1, S0, D8, D4, D2, D1 of the bit control signal 29, the states of the data inputted into the I/O buffer 30 from the external data bus 31 (E7, E6, E5, E4, E3, E2, E1, E0), and the states of the data outputted from the I/O buffer 30 to the data lines 25 (B7, B6, B5, B4, B3, B2, B1, B0) have a relation of FIG. 8. As understood from FIG. 8, the effective word length (the number of effective bits) of the data outputted to the data lines 25 (B7, B6, B5, B4, B3, B2, B1, B0) is changed among 1 bit, 2 bits, 4 bits, and 8 bits in response to the bits D8, D4, D2, and D1 of the bit control signal 29. In addition, the effective bit or bits of the data outputted to the data lines 25 (B7, B6, B5, B4, B3, B2, B1, B0) occupy the LSB position or successive lower-order bit places starting from the LSB position. Furthermore, the position or positions of a bit or bits selected from among the bits of the data on the external data bus 31 (E7, E6, E5, E4, E3, E2, E1, E0) as an effective bit or effective bits of the data outputted to the data lines 25 are controlled in response to the bits S2, S1, and S0 of the bit control signal 29.

The column address decoder 16 is enabled by the decoder control signal 23, decoding the column address signal fed from the address input buffer 12A. The column address decoder 16 selects "k" bit lines from among the "n" bit lines 18 which are designated by the column address signal. The column address decoder 16 connects the data lines 25 to the selected bit lines 18 respectively so that the data is transmitted from the data lines 25 to the selected bit lines 18. Then, the data is applied from the selected bit lines 18 to the memory cells connected to the selected bit lines 18.

The row address decoder 15 is enabled by the decoder control signal 23, decoding the row address signal fed from the address input buffer 12A. The row address decoder 15 selects and activates one of the word lines 17 which is designated by the row address signal. Pieces of the data on the selected bit lines 18 are written into the memory cells respectively which are connected to the activated word line 17.

What is claimed is:

1. A semiconductor memory device comprising:

a memory cell array;

means for accessing the memory cell array word by word in response to an address signal;

a bit control circuit for generating a bit control signal; and an I/O buffer for transmitting data between the memory cell array and an external means when the memory cell array is accessed by the accessing means;

wherein the I/O buffer includes means for controlling an effective bit or effective bits in one word related to the accessing of the memory cell array in response to the bit control signal, and means for controlling a position of the effective bit or positions of the effective bits in one word related to the accessing of the memory cell array in response to the bit control signal.

2. A semiconductor memory device comprising:

an array of memory cells grouped into words;

first means for accessing the memory cell array word by word;

second means for generating a bit control signal;

third means for controlling an effective bit or effective bits in every word related to the accessing of the memory cell array by the first means in response to the bit control signal; and fourth means for controlling a position of the effective bit or positions of the effective bits in every word related to the accessing of the memory cell array by the first means in response to the bit control signal.

3. The semiconductor memory device of claim 2, wherein the first means comprises means for accessing the memory cell array in response to a main address signal, and the second means comprises means for generating the bit control signal in response to an extended address signal separate from the main address signal.

* * * * *